United States Patent [19]

Fodali et al.

[11] 4,361,800
[45] Nov. 30, 1982

[54] CIRCUIT TEST DEVICE

[75] Inventors: Adolph Fodali, Lake Hiawatha; George Gering, Livingston, both of N.J.

[73] Assignee: S & G Tool Aid Corp., Newark, N.J.

[21] Appl. No.: 168,073

[22] Filed: Jul. 14, 1980

[51] Int. Cl.³ .......................................... G01R 31/00
[52] U.S. Cl. ..................................... 324/53; 324/72.5
[58] Field of Search .................... 324/51, 53, 72.5, 133

[56] References Cited

U.S. PATENT DOCUMENTS

| | | | |
|---|---|---|---|
| 2,581,116 | 1/1952 | Lewis | 324/51 |
| 2,639,318 | 5/1953 | Roches | 324/51 |
| 3,196,217 | 7/1965 | Petrina | 324/72.5 X |

FOREIGN PATENT DOCUMENTS 659621 10/1951 United Kingdom ................. 324/53

Primary Examiner—Stanley T. Krawczewicz
Attorney, Agent, or Firm—James and Franklin

[57] ABSTRACT

A probe extends from a two-part plastic housing. The first part has an externally threaded cylindrical section, which is adapted to mate in screw fashion with an internally threaded cylindrical section of the second part. A member is inserted between the parts and includes a cylindrical portion, receivable within the threaded section of the first part for structural reinforcement of the housing, and a flange, positioned adjacent the rim of the first part, to properly locate the member. In one embodiment, the first part and the member are provided with oppositely directed slots which align to form a radially extending channel through which a lead extends. The sides of the channel engage the lead to provide strain protection. A spare bulb mount is provided on the member and extends into a cavity formed in the second part. In a second, self-powered, embodiment, the structure of the member is modified to eliminate the bulb mount to permit a battery to be received within the cavity of the second part.

9 Claims, 4 Drawing Figures

CIRCUIT TEST DEVICE

BACKGROUND OF THE INVENTION

The present invention relates to electrical test devices and, more particularly, to a hand-held device designed to test circuits of the type having a two-part plastic housing and an insert which serves to structurally reinforce the walls of the housing and, in one embodiment, additionally provides strain protection for an extending lead, as well as a mount for a spare bulb.

Devices for testing electrical circuits have been long known in the art and have taken a variety of different forms. However, circuit test devices to which the present invention pertains are of the hand-held type which, in general, comprise a plastic housing designed as a handle to be grasped by the hand of the operator. A test probe or pin extends from the handle and is used to make contact with specific areas of the circuit under test. An indicating device, and associated components, are situated within the housing. A wire lead, usually having an alligator clip or the like on the end thereof, also extends from the housing. The lead is connected to one portion of the circuit under test and the hand-held probe is utilized to contact other portions of the circuit. If the circuit under test is functioning properly, the indicating device, such as a small incandescent bulb or the like, will be energized. The housing is fabricated of translucent or transparent plastic, such that the bulb is visible.

Test devices of this type are designed either to utilize the power of the circuit under test, or to provide the necessary power to energize the circuit during the test. In the latter case, the housing from which the probe extends is provided with a cavity into which a power source, such as a battery or the like, is received. The battery provides the electrical power to energize the circuit for the test.

Both types of circuit test devices employ a means for mounting an incandescent bulb or lamp within the housing and the self-powered type additionally includes a means for mounting a battery within a cavity in the housing. It is, therefore, necessary to construct the housing such that access to these components is possible to permit replacement thereof. For this reason, conventional circuit test devices of this type normally consist of a plastic housing, large enough to carry the necessary components, which is generally cylindrical in form, so as to provide a handle-type member which can be easily grasped and manipulated by the user. The housing is formed in two parts which are removably connectable so as to permit the housing to be easily opened for access to the components situated therein.

A common manner of joining the housing parts is to form overlapping sections and to externally thread the section of one part and internally thread the section of the other part, such that the overlapping sections can be screwed together. The screw threads are formed in each part by providing a helical groove in the cylindrical wall thereof. In the section of the first part, the groove is formed in the exterior of the wall, such that the surface of the thread is aligned with the surface of the wall of the non-threaded section. Thus, the structure of the wall in the threaded section is weakened because certain portions thereof are thinner, by a distance equal to the depth of the groove, than the remainder of the wall.

The parts are joined together at the middle of the housing. When the device is used, the forces concentrate at this point. If the externally threaded section is not sufficiently strong to withstand these forces, same will collapse, destroying the usefulness of the device.

It is, of course, possible to increase the thickness of the entire wall of the first part to provide the necessary strength. However, the present high cost of plastic makes this an uneconomical solution to this problem.

It is necessary that a lead extend from the plastic housing to permit completion of the test circuit. In some devices, instead of forming a separate opening in the housing through which the lead may extend, it is economical to provide the externally threaded section of the part of the probe with an axially extending elongated slot through which the lead may extend when the parts of the housing are assembled. The slot must be longer than the overlap between the parts, by a distance at least equal to the diameter of the lead, such that the lead can extend therethrough when the parts are assembled. Thus, the slot in the externally threaded section of the part through which the lead extends must be relatively long. When such a slot is employed, the wall of the externally threaded section is further weakened because the slot interrupts the inherent strength of the cylindrical wall.

The lead is internally connected to the base of the active incandescent bulb situated in the first part. In order to prevent strain on the connection between the lead and the base, a knot is formed in, or a washer-like member is affixed to, the section of the lead within the housing adjacent the opening from which the lead extends, thus preventing disconnection of the lead end if undue force is exerted on the lead, such as by pulling or the like.

As mentioned previously, circuit test devices of this type normally utilize an indicating device such as a small incandescent bulb, which is situated within the plastic housing and is energized when the circuit under test is operational. However, since the devices are designed to be portable for use in the field, it is desirable to incorporate a spare bulb therein, to be used in the event that the primary bulb ceases to function, and thus to provide facility for carrying the spare bulb within the housing itself. However, in order to do so, the housing must be provided with a means of retaining the spare bulb in a fixed position therein such that the bulb, which is relatively fragile, will not be broken or damaged by the handling of the device.

It is, therefore, a prime object of the present invention to provide a circuit test device comprising a plastic housing with walls of reduced thickness.

It is another object of the present invention to provide a circuit test device comprising a first part having an externally threaded section and a second part having an internally threaded section with a member insertable therebetween which serves to structurally reinforce the thin-walled, externally threaded section of the first part.

It is another object of the present invention to provide a circuit test device having means on the externally threaded section and on the member which cooperate, when the housing is assembled, to provide a radial channel through which a lead may extend and, at the same time, provide the lead with the necessary strain protection.

It is another object of the present invention to provide a circuit test device having facility to securely mount a spare bulb within the housing.

It is another object of the present invention to provide a circuit test device wherein a member is inserted between the housing parts, the member having a radially extending flange which is retained between the parts so as to properly position the member.

It is another object of the present invention to provide a circuit test device of the self-powered type wherein a battery is received within a cavity in the part having an internally threaded section, and wherein a member is inserted between the parts so as to increase the structural strength of the externally threaded section of the other part and permit electrical connection between the parts.

It is a further object of the present invention to provide a circuit test device which is formed of relatively simple, inexpensive parts which cooperate in a reliable and maintenance-free fashion.

In accordance with the present invention, a circuit test device is provided comprising a housing, a probe mounted to and extending from the housing, and a lead extending from the housing. The housing includes a first part having an externally threaded substantially cylindrical section. The externally threaded cylindrical section of the first part includes a wall having an internal diameter of a given dimension. A second part is provided having an internally threaded section adapted to cooperate with the externally threaded section of the first part to removably connect the parts. Inserted between the parts is a member having a substantially cylindrical portion with an external diameter substantially equal to the internal diameter of the wall of the externally threaded cylindrical section of the first part. This portion of the member is adapted to be received within the first part, adjacent the externally threaded cylindrical section thereof, when the housing is assembled, to enhance the structural strength of the externally threaded cylindrical section of the first part.

The wall of the externally threaded cylindrical section of the first part has a rim. The member further includes a flange extending radially from the edge of the substantially cylindrical portion thereof. The flange is adapted to be received adjacent the rim of the first part, when the housing is assembled, so as to properly locate the member with respect to the parts.

In a first preferred embodiment, the externally threaded cylindrical section of the first part is provided with a slot therein, the slot being elongated in a direction parallel to the axis of the housing. The member, and, more particularly, the substantially cylindrical portion thereof, is provided with a second slot therein. The slots are adapted to at least partially align, when the member is received within the first part, so as to form a substantially radial channel through the housing. A lead is adapted to extend through the channel. The lead comprises a conductive wire surrounded by an insulating coating or layer. The channel has an inner diameter which is smaller than the outer diameter of the insulating layer of the lead, but larger than the outer diameter of the wire. When the housing is assembled with the lead extending through the channel, the walls of the channel engage the insulating layer of the wire so as to provide strain protection therefor. Thus, the first part and the member each comprise means thereon which cooperate, when assembled, to engage the lead so as to prevent same from being displaced relative to the housing.

In the first preferred embodiment, the member additionally comprises means for mounting a spare bulb thereon. The bulb mounting means extends from the member in the direction of the second part when the housing is assembled. The second part preferably comprises a cavity therein. The bulb mounting means extending from the member is received within the cavity in the second part when the housing is assembled.

In a second preferred embodiment, a battery or similar power source is situated within the cavity in the second part of the housing, so as to make the test device self-powered. In this embodiment, the structure of the first part and, particularly, the externally threaded section thereof, is altered to eliminate the slot therein, as is the cylindrical portion of the member so as to eliminate the slot therein. In addition, the spare bulb mounting means, present on the member in the first embodiment, is eliminated so as to provide room for the battery and permit electrical connection of the battery, through the member and to the first part of the housing.

To these and such other objects which may hereinafter appear, the present invention relates to a circuit test device, as described in detail in the following specification and recited in the annexed claims, taken together with the accompanying drawings, wherein like numerals refer to like parts, and in which:

Figure 1:
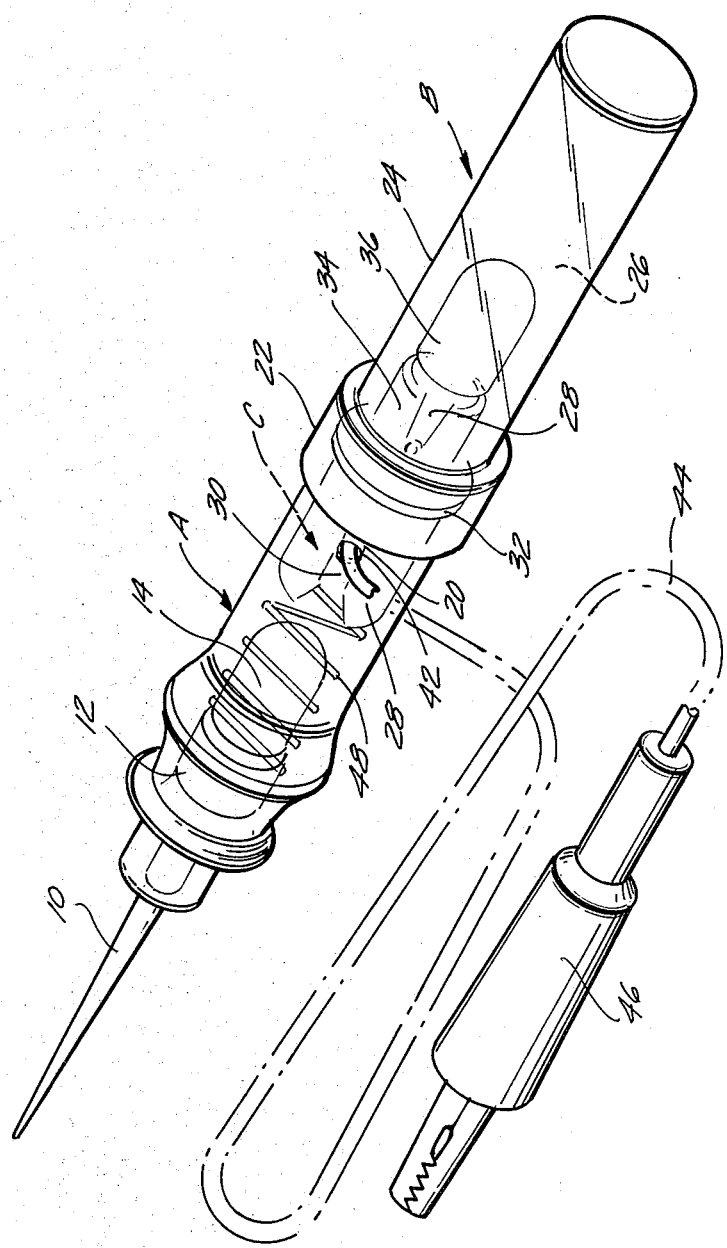
FIG. 1 is an isometric view of a first preferred embodiment of the present invention.
Figure 2:
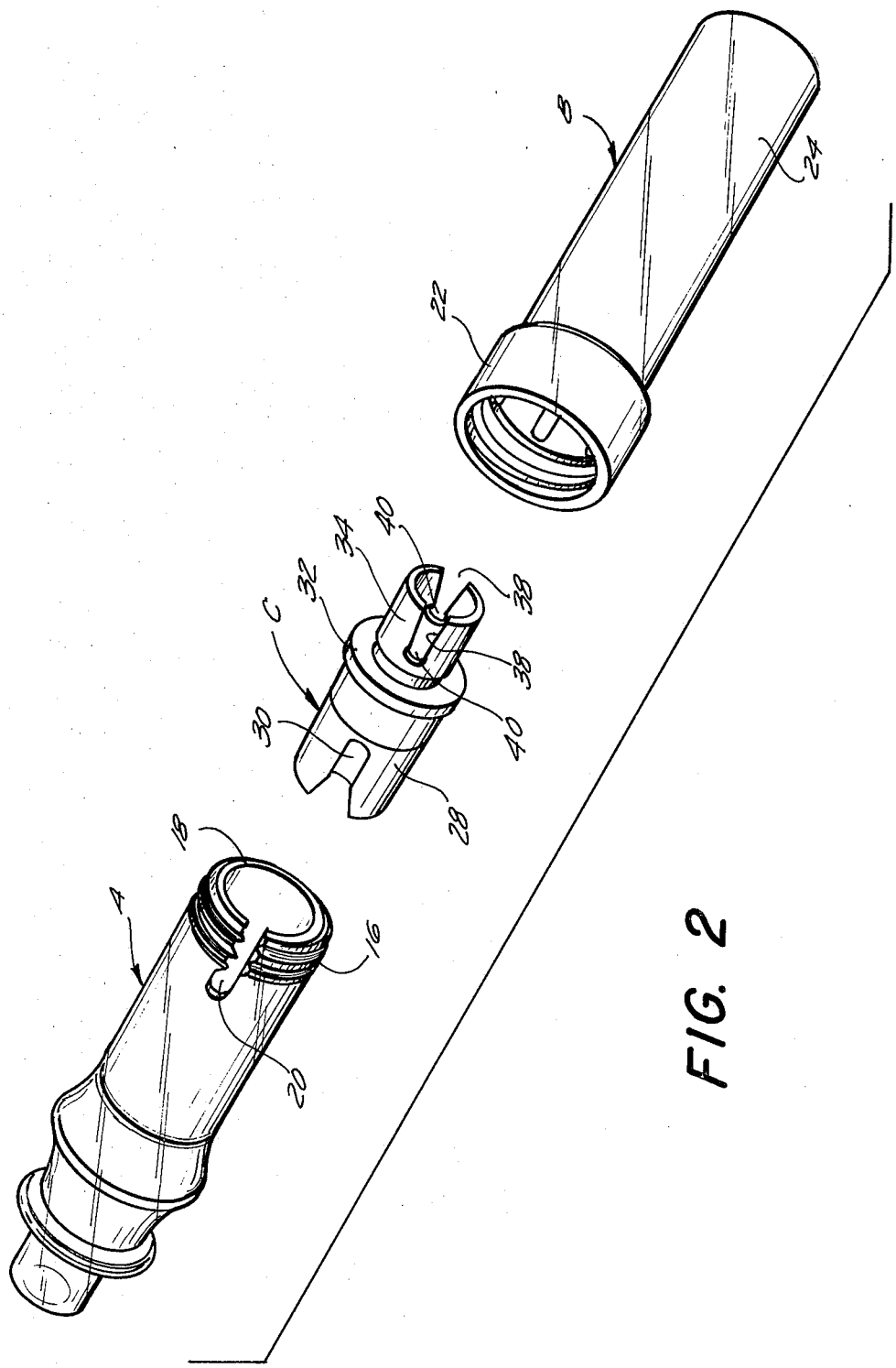
FIG. 2 is an exploded isometric view of the first preferred embodiment of the present invention.
Figure 3:
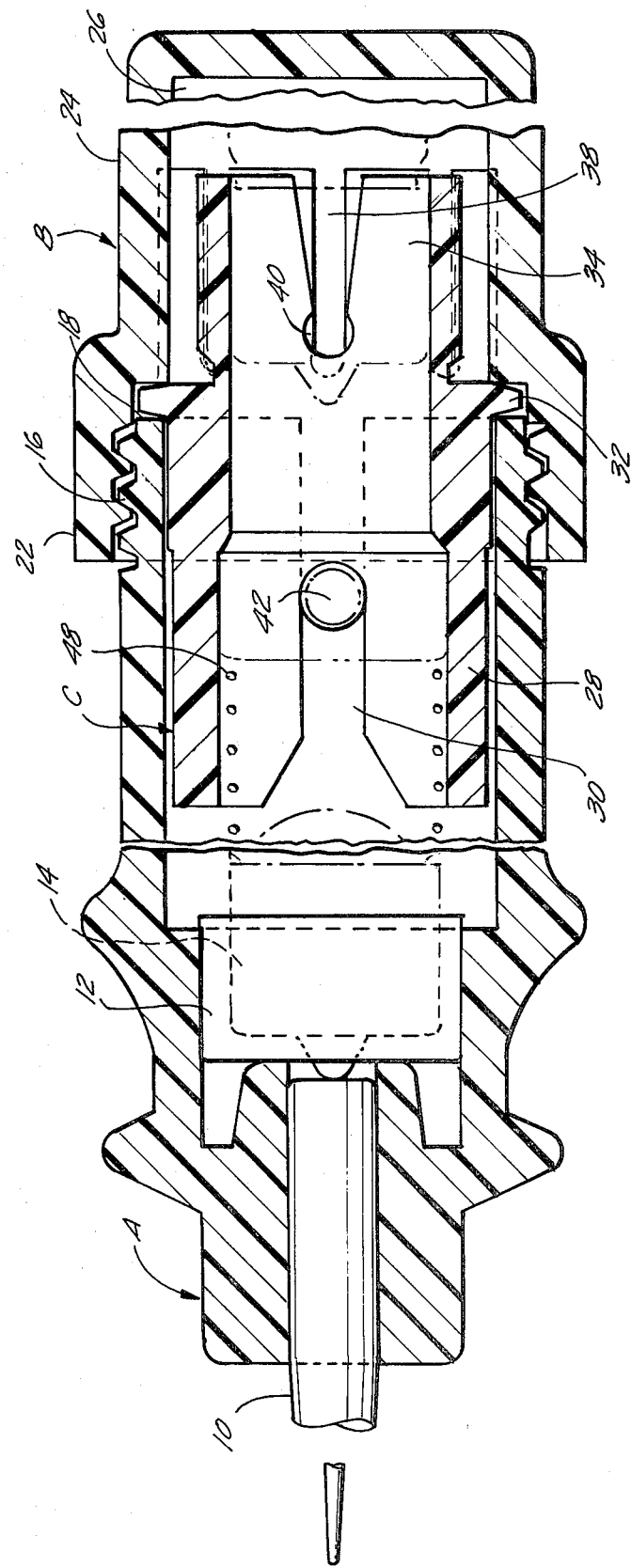
FIG. 3 is a side cross-sectional view of a first preferred embodiment of the present invention.

As seen in FIGS. 1, 2 and 3, the first preferred embodiment of the present invention comprises a housing consisting of a substantially cylindrical first part, generally designated A, a substantially cylindrical second part, generally designated B, with a member, generally designated C, designed to be received between parts A and B when the housing is assembled. Part A is provided at its forward end with an axially extending channel into which a conductive probe or pin 10 is received and fixedly mounted. The portion of part A beyond probe 10 is thickened to provide a grip at the exterior thereof and the interior thereof is hollow, forming a cavity 12, into which is mounted a conductive bulb 14, of any conventional type. Bulb 14, illustrated in the drawing, is of the bayonet type, but bulbs and sockets therefor of the screw type may also be utilized. Parts A and B are preferably made of transparent or translucent plastic to permit the bulb to be visible. Towards the rear end of part A is an externally threaded substantially cylindrical section 16. Section 16 has a rim 18, and is provided with an axially extending elongated slot 20.

As can best be seen from FIG. 3, section 16 is formed by providing a helical groove in the surface of part A, near the rear end thereof. The apex of the threads are, thus, equal in height to the thickness of the walls of the non-threaded section, and the thickness of the wall under the grooves is much less than the thickness of the walls of the non-threaded section. Thus, section 16 has less structural strength than the remainder of part A. Moreover, slot 20 in section B further reduces the inherent strength of the cylindrical section 16.

Part B comprises a forward internally threaded substantially cylindrical section 22 having an enlarged outer diameter, as compared with the wall of section 16, and an inner diameter approximately equal to the outer diameter of section 16. Section 22 is adapted to overlap and mate with section 16, in screw fashion, so as to removably connect parts A and B. The rear section 24 of part B has a slightly smaller outer diameter than portion 22 and is hollow, forming a cavity 26 therein.

Member C is provided with a substantially cylindrical portion 28 having an axially directed elongated slot 30 therein. Adjacent portion 28 is a radially extending circular part or flange 32. The rear portion of member C comprises a mount 34 for a spare incandescent bulb 36. Mount 34 is provided with axially extending side slots 38 to accommodate the radially extending protrusions of an incandescent bulb with a bayonet-type base. The base is inserted into mount 34 with the radially extending protrusions thereof aligned with slots 38, and then pushed towards the bottom of the mount until the protrusions are situated within the enlarged end portions 40 of slots 38, so as to removably secure the bulb to the mount.

When assembled, section 28 of member C is received within section 16 of part A, with slot 30 of member C aligned with slot 20 of part A. The outer diameter of portion 28 of member C is approximately equal to the inner diameter of portion 16 of part A such that a relatively snug fit therebetween is achieved. In this manner, portion 28 of member C acts as a structural reinforcement for portion 16 of part A.

When member C is fully inserted within part A, flange 32 rests on rim 18 so as to properly position the member. Slot 20 in section 16 is longer than portion 22 of part B such that when part B is received on part A, with section 28 overlapping section 16, the forward portion of slot 20 will not be covered by section 22 of part B. Slot 30 in member C is designed such that when member C is fully received within part A, a portion of slot 30 overlaps the exposed portion of slot 20, so as to form a radial channel 42 through the housing.

A lead 44, which may have an allegated clip 46 on the end thereof, extends through channel 42 to the interior of the housing. Lead 44 comprises a conductive wire surrounded by an insulating coating or layer. Slots 20 and 30 are dimensioned such that the resulting radial channel 42 will be larger than the outer diameter of the conductor of lead 44, but less than the outer diameter of the insulating layer surrounding same. Thus, the walls of channel 42 will engage the lead coating so as to prevent displacement of the lead relative to the housing. The conductor of lead 44 is soldered to a terminal in contact with a spring-like element 48, or is electrically connected thereto in any conventional manner. Spring-like conductive element 48 extends within part A and serves to electrically connect lead 44 to the base of bulb 14.

Channel 42 serves a dual purpose. It permits lead 44 to extend into the interior of the housing for connection with socket 12. It also provides strain protection for the connection between lead 44 and element 48, such that the connection therebetween will not be severed by forces applied to lead 44, such as by pulling same in the direction away from the housing.

Figure 4:
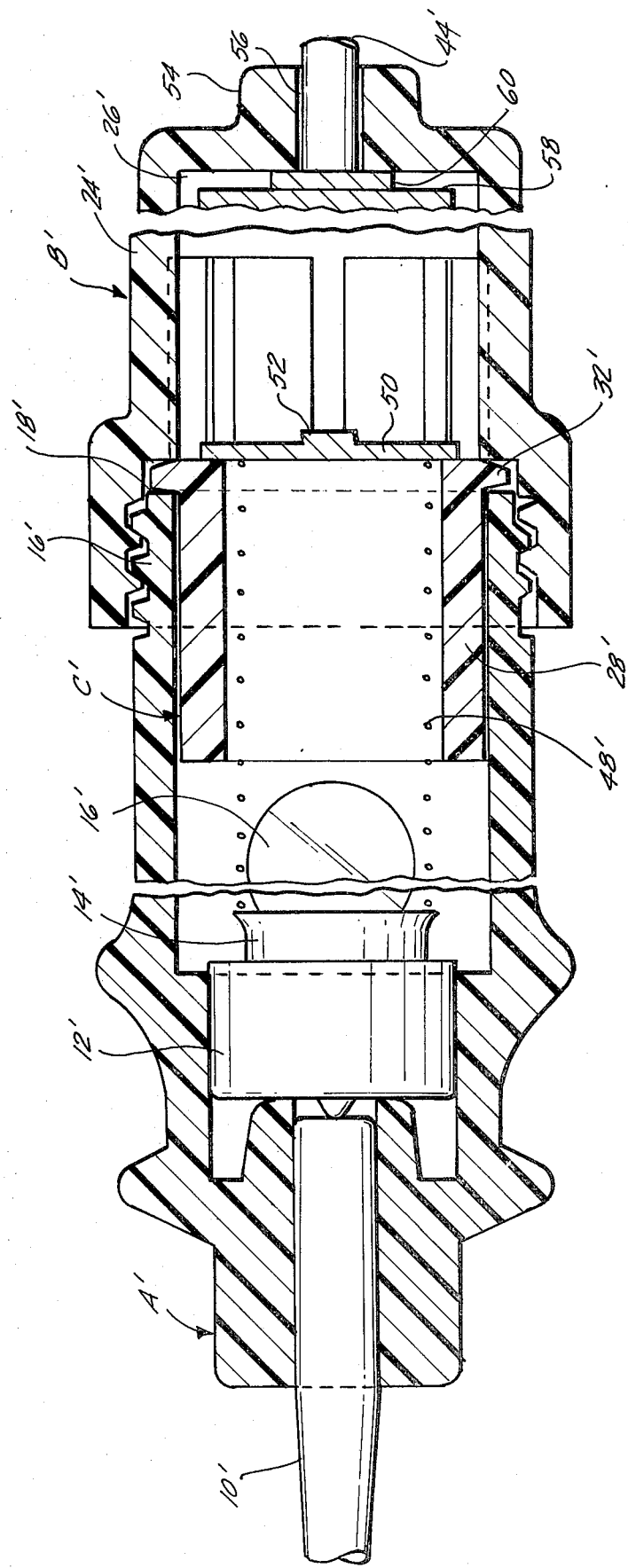
FIG. 4 is a side cross-sectional view of a second preferred embodiment of the present invention.

FIG. 4 shows a second preferred embodiment of the present invention. In this case, the device is a self-powered continuity tester which has a battery situated within the housing and, particularly, cavity 26 of part B thereof. With the few exceptions discussed below, the second preferred embodiment has a structure which is identical to that of the first preferred embodiment. For this reason, the portions of the device of the second preferred embodiment which are identical to those of the first preferred embodiment are provided with the same number to denote equivalence, but are numbered on FIG. 4 with primes to distinguish same and a detailed description of the structure of these parts is omitted as being redundant.

The structure of member C' differs from that of member C in that member C' is tubular in configuration, and no equivalent for spare bulb mount 34 is provided. The spare bulb mount must be eliminated because there is no room for a spare bulb when a battery is situated within cavity 26' of part B', and electrical connection between the housing parts is required. Thus, part C' has a passageway therethrough through which spring-like conductive member 48' extends.

Situated within part B' is a conductive contact 50 having a central protrusion 52 thereon. Protrusion 52 is designed to engage one pole of a battery, which cavity 26' is designed to receive. Thus, contact 50 serves to provide electrical connection between the battery and one end of spring-like conductive member 48', the other end of which is connected to the base of bulb 14'.

At the rear end of part B' is a rearwardly extending portion 54 having an axial channel 56 therethrough. Lead 44' extends through channel 56. The end of lead 44' is connected to a second contact 58 which is positioned to engage the other pole of the battery within cavity 26'. Located between contact 58 and lead 44' is a washer-like member 60 affixed to the insulation on lead 44' so as to provide strain protection for the connection between lead 44' and contact 58, in a conventional fashion.

It will now be appreciated that the present invention relates to an electrical test device comprising a plastic handle housing with a part having walls of reduced thickness. More particularly, the thin-walled, externally threaded section of one part of the housing is structurally reinforced through the use of a member insertable between the parts of the housing when same are assembled, thus permitting same to have walls of reduced thickness. The member has a cylindrical portion with an outer diameter substantially equal to the inner diameter of the externally threaded section of the part, such that same prevents the externally threaded section of the part from collapsing under stress.

In addition, the externally threaded section of one part of the housing and the cylindrical portion of the member are both provided with means which cooperate, when the housing is assembled, to provide a radial channel through which a lead may extend and, at the same time, provide the lead with the necessary strain protection. Further, in one preferred embodiment of the present invention, the member is provided with a mount adapted to receive a spare bulb, such that same is situated within a cavity in the second part and protected from damage.

In a second preferred embodiment, the structure of the member is altered so as to eliminate the radial channel-forming slot and the spare bulb mount. In this case, the member acts to structurally reinforce the externally threaded section of one part of the housing and permit electrical connection between the parts when the housing is assembled.

While only two preferred embodiments of the present invention have been disclosed herein for purposes of illustration, it is obvious that many variations and modifications could be made thereto. It is intended to cover all of these variations and modifications which fall within the scope of the present invention, as defined by the following claims.

We claim:

1. A circuit test device comprising a housing, a probe mounted to and extending from said housing, and a lead extending through said housing, said housing comprising: a first part, comprising an externally threaded, substantially cylindrical section with a wall having an internal diameter of a given dimension; a second part comprising an internally threaded section adapted to cooperate with said externally threaded section of said first part to removably connect said parts; and a member comprising a substantially cylindrical portion having an external diameter substantially equal to said given dimension, said member being adapted to be received within said externally threaded cylindrical section of said first part, wherein said first part and said member each comprise means which cooperate to form a channel through which the lead extends, said cooperating means engaging the lead so as to prevent same from being displaced relative to said housing.

2. The device of claim 1, wherein said externally threaded section of said first part has a first slot therein and wherein said portion of said member has a second slot therein, said slots being adapted to at least partially align when said member is received within said first part, so as to form a substantially radial channel through said housing.

3. The device of claim 2, wherein the lead extends through said channel.

4. The device of claim 2, wherein the lead comprises a conductive wire and an insulating layer surrounding said wire, said layer having a given outer diameter and wherein said channel has an inner diameter, smaller than said given outer diameter of said layer, but larger than the outer diameter of said wire.

5. A circuit test device comprising a housing, a bulb, means for mounting said bulb within said housing, a probe mounted to and extending from said housing and a lead extending through said housing, said probe and said load being operably electrically connected to said bulb, said housing comprising a first part, a second part, means for removably connecting said parts and a member adapted to be received within said housing, said member comprising means for mounting a spare bulb thereon.

6. The device of claim 5, wherein said bulb mounting means extends in the direction of said second part, when said housing is assembled.

7. The device of claim 5, wherein said second part comprises a cavity and wherein said bulb mounting means is received within said cavity when said housing is assembled.

8. A circuit test device comprising a housing, a bulb, means for mounting said bulb within said housing, a probe mounted to and extending from said housing, said probe being operably electrically connected to said bulb, means for mounting a battery within said housing, and a lead extending through said housing, said lead being operably electrically connected to said battery mounting means, said housing comprising a first part, a second part, means for removably connecting said parts, and a member adapted to be received within said housing between said bulb mounting means and said battery mounting means, said member comprising a passageway and means for operably electrically connecting said battery mounting means and said bulb, said electrical connecting means extending through said passageway in said member.

9. The device of claim 8, wherein said electrical connecting means comprises electrically conductive spring means.

* * * * *